United States Patent [19]
Sonntag et al.

[11] Patent Number: 5,499,163
[45] Date of Patent: Mar. 12, 1996

[54] PRINTED CIRCUIT BOARD CLAMP FOR HOUSINGS OF ELECTRONIC, ELECTRIC AND APPARATUS INSTALLATIONS

[75] Inventors: John-Erik Sonntag, Tammisaari; Matti Ropponen, Espoo, both of Finland

[73] Assignee: Fibox Oy AB, Tammisaari, Finland

[21] Appl. No.: 308,663

[22] Filed: Sep. 19, 1994

[30] Foreign Application Priority Data

Sep. 24, 1993 [FI] Finland .................................. 934202

[51] Int. Cl.⁶ .................................................... H05K 5/00
[52] U.S. Cl. .......................... 361/759; 361/752; 361/756; 361/796; 361/801; 439/44; 174/250; 211/41
[58] Field of Search ..................... 361/744, 748, 361/747, 752, 758, 759, 761, 785, 788, 790, 792, 796, 800–802, 807, 810, 813; 439/74, 75, 82, 92, 94, 95, 106, 44, 45; 174/52.4, 250; 211/41

[56] References Cited

U.S. PATENT DOCUMENTS

| 4,461,593 | 7/1984 | Rodseth . | |
|---|---|---|---|
| 4,929,185 | 5/1990 | Wong et al. | 439/74 |
| 4,950,170 | 8/1990 | Miller, Jr. | 439/74 |
| 5,091,826 | 2/1992 | Arnett et al. | 361/408 |
| 5,206,796 | 4/1993 | Thompson et al. | 361/424 |
| 5,260,854 | 11/1993 | Hileman et al. . | |

FOREIGN PATENT DOCUMENTS 9106714  7/1991  Germany .

*Primary Examiner*—Leo P. Picard
*Assistant Examiner*—Y. Whang
*Attorney, Agent, or Firm*—Merchant, Gould, Smith, Edell, Welter & Schmidt

[57] ABSTRACT

A printed circuit board clamp, for clamping a printed circuit board to a housing of electronic, electric and apparatus installations, is secured to at least one fixing stud (1) disposed at the bottom of the housing and is provided with a bore (2). The clamp has an elongated body (4) having two ends (6 and 7) and an interconnecting neck portion (8) between the ends. The clamp also has fixing assembly (14–17) for securing the printed circuit board to the clamp. Each of the two ends of the clamp has a throughgoing aperture (9, 10) for screws or the like. At least one of the apertures is elongatedly shaped for securing the clamp to the fixing stud. To substantially facilitate mounting of printed circuit boards within different housings, the clamp includes at least a weakening point (25, 26) that can be broken manually without any tools in order to separate the ends (6, 7) of the clamp from the neck portion.

7 Claims, 1 Drawing Sheet

PRINTED CIRCUIT BOARD CLAMP FOR HOUSINGS OF ELECTRONIC, ELECTRIC AND APPARATUS INSTALLATIONS

BACKGROUND OF THE INVENTION

The present invention relates to a printed circuit board clamp for housings of electronic, electric and apparatus installations, which clamp is to be secured to at least one fixing stud disposed at the bottom of the housing and provided with a bore, and comprising an elongated body having two ends and an interconnecting neck portion between the ends, and fixing means for securing the printed circuit board to the clamp, both ends of the clamp having a throughgoing aperture for screws or the like and at least one of said apertures being elongatedly shaped, for securing the clamp to said fixing stud.

A wide variety of solutions exist for mounting and securing printed circuit boards (PCBs) within housings. For example, the walls of the housing may incorporate bar-type holders for receiving the PCB. For electronic, electric and apparatus installations, housings are often employed that have bottoms provided with fixing studs having a bore. The purpose of the fixing studs is to serve as fixing points for various components. The fixing usually employs screws. Typically, there are several fixing studs arranged along the sides of the housing. As securing of the PCB to the fixing studs provided in the housing makes holder bars unnecessary, as far as possible the PCB is secured to such studs.

However, securing of a PCB, and also certain other components, to fixing studs provided in the bottom of a housing is not problem-free. A significant problem is that the distance between the fixing studs does not correspond to the distance between the fixing holes provided in the PCB or other component, and thus the fixing points cannot be used as such. In a case of this kind, the securing must be arranged in some other manner, for example by using various clamps. Another problem relating specifically to PCBs is that the PCB cannot be secured to the studs without that the lower surface of the bottom or the soldering spots which extend from the bottom of the PCB make contact with the fixing studs provided in the bottom of the housing. As such a contact cannot normally be permitted, the fixing studs must be machined out from the bottom of the housing, for instance by milling. In some cases, an alternative is to modify the tool with which the housing is produced, so that some of the fixing studs are not formed. Yet modifying the tool is costly. In some cases, annular lift adapters may be used for lifting the PCB to a sufficient degree. Lift adapters do not, however, remove the above-mentioned problem, i.e., the fact that the fixing studs in the bottom of the housing do not match the fixing holes provided in the PCB on account of their relative distances. In this connection, it is to be noted that PCBs today are often Europe-boards and thus have a given size and the distance between the fixing holes is determined (89 mm).

SUMMARY OF THE INVENTION

It is an object of the present invention to remove the above problems relating to the securing of a PCB. For this purpose, the PCB clamp of the invention is characterized in that the neck portion comprises a weakening point that can be broken manually without any tools in order to separate the ends of the clamp from each other. Preferably the fixing means comprise a groove having the direction of the clamp for receiving the printed circuit board, said groove being provided at both ends of the clamp and being at such a distance from the surface of the clamp bearing against the fixing stud of the housing that the clamp lifts the lower surface of the printed circuit board to be spaced from the upper level of the fixing stud. Hereby possible contact of the lower surface of the PCB, and the soldering spots that extend somewhat from the surface, with the fixing studs is prevented, as such a contact could damage the PCB or prevent its rigid securing. The groove supports the PCB for a considerable portion of its side length. Preferably both apertures in the clamp are shaped as elongated apertures having the longitudinal direction of the clamp. Thus a fixing point will be readily found even when housings are used in the bottom of which fixing studs are provided in a relatively spaced-apart relationship. Preferred embodiments of the clamp of the invention are disclosed in the appended claims 2–7.

The most significant advantage of the PCB clamp of the invention is that it considerably facilitates mounting of PCBs and particularly Europe-boards within different housings. The preferred embodiment of the invention lifts the PCB above the fixing studs and prevents, in a simple manner, damaging contact of the PCB with the fixing studs, without any need of extra machining within the housing or modifications in the tool with which the housing is produced.

BRIEF DESCRIPTION OF THE DRAWINGS

The invention will now be explained in greater detail by means of a preferred embodiment with reference to the accompanying drawing, in which.

BRIEF DESCRIPTION OF THE PREFERRED EMBODIMENT

Figure 1:
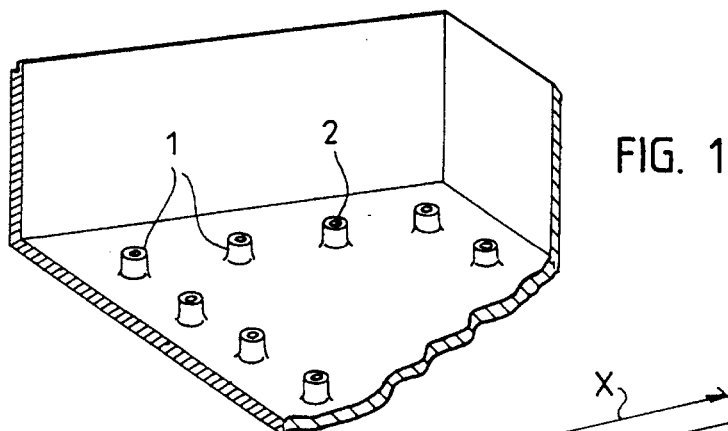
FIG. 1 is a partial sectional view of a housing for electronic installations.

FIG. 1 shows a plastic housing of the known type for electronic and electrical installations. The housing may equally well be of aluminum or sheet iron when the invention is implemented. The cover of the housing is not shown. The bottom at the lower part of the housing has several fixing studs 1, which constitute an integral part of the bottom. The fixing studs have bores 2 or recesses into which a screw can be screwed. By means of the screw and the fixing stud, a component to be mounted within the housing can be secured to the bottom of the housing.

Figure 2:
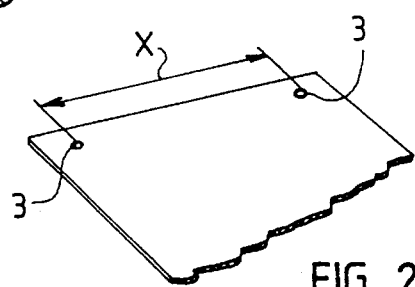
FIG. 2 shows a PCB to be mounted within the housing of FIG. 1.

FIG. 2 shows a conventional PCB the corners of which have holes 3 for securing a connector (not shown) to the PCB or for securing the PCB to the housing with screws. The PCB is an Europe-board, and thus its size and the distance X between the holes 3 (89 mm) are determined.

Figure 3:
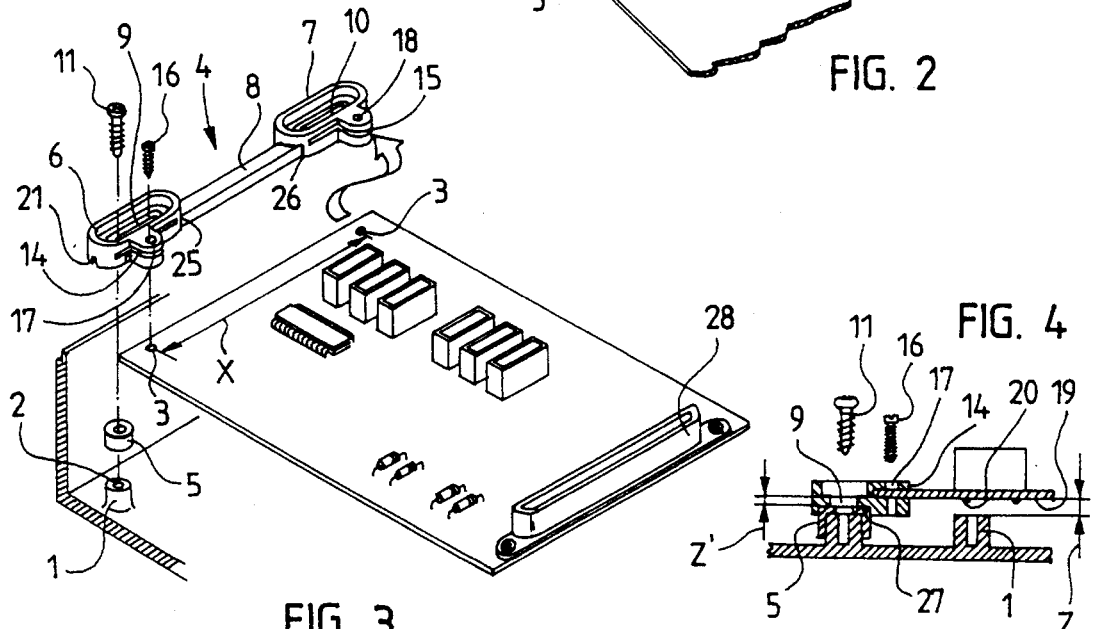
FIG. 3 illustrates securement of a PCB to the bottom of the housing with a PCB clamp of the invention.
Figure 4:
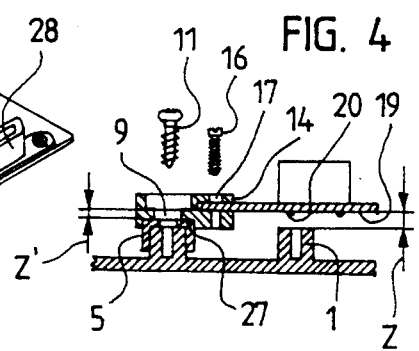
FIG. 4 shows how the PCB of FIG. 3 is secured to the bottom of the housing with the PCB clamp of the invention.

In order that the PCB of FIG. 2 may be secured to fixing studs 1, the distance between two studs 1 shall correspond to the distance X=89 mm. As the distance between the studs is not 89 mm, the PCB cannot be directly secured to the fixing studs 1. FIGS. 3 and 4 illustrate how the PCB can be secured to the bottom of the housing with the PCB clamp 4 and an adapter ring 5. The PCB clamp 4 is formed so as to be readily (more readily than the actual PCB) secured to the fixing studs 1 provided in the bottom of the housing, the distance between the studs varying depending on the housing employed.

The PCB clamp 4 comprises an elongated body having two ends 6 and 7 and a neck portion 8 connecting them. The ends 6, 7 have throughgoing apertures 9 and 10. On account of the fact that the apertures 9, 10 are elongated, a pair of fixing studs the bores 2 of which match the elongated apertures 9, 10 will readily be found in the bottom of the housing. Thus the clamp can be secured to the bottom of the housing with screws 11 going through said bores and apertures. The purpose of the cap-like adaptor ring 5 is to secure the clamp 4 without spacing to the fixing stud 1 regardless of the exact size of the fixing stud. Thus the clamp can be precisely and rigidly secured to fixing studs having slightly different diameters in different housings. The outer diameter of the adaptor ring 5 corresponds to the distance Y between the edges 12, 13 surrounding the apertures 9, 10, said distance being 14 mm in this exemplary case. The inner diameter of the adapter ring 5 is dependent on the diameter of the fixing studs. In the exemplary case the diameter is 12 mm. Adapter rings of different inner diameters are available on the market. The adapter ring is not, however, indispensable.

When the clamp 4 is screwed in place, the PCB is inserted in the direction of the arrow in FIG. 3 into the longitudinal grooves 14, 15 provided at the ends 6, 7 of the clamp. The grooves may be so narrow that the PCB is clamped in them and is held stationary on account of the clamping force. In the case of FIGS. 3 and 4, however, additional fixing with screws 16 is shown. The screws 16, which are tightened down into the bores 17, 18 provided at the ends of the clamp, enable PCBs of slightly varying thicknesses to be secured to the clamp. The screws 11 and 16 are preferably of the self-working type, and thus no nut is needed. The bores 17, 18 are distanced X=89 mm, which corresponds to the distance between the holes 3 in the PCB.

It is seen from FIG. 4 that the groove 14 is at distance Z from the upper surface of the fixing stud 1. On account of this distance, the solder spots 20 extending from the lower surface 19 of the PCB do not make contact with the fixing studs 1. The distance Z equals to the thickness of the cap portion of the adapter ring 5 plus the distance Z' between the clamp groove 14 and the surface 27 of the clamp that bears against the cap portion of the adapter ring. If an adapter ring 5 is not provided, the distance between the lower surface 19 of the PCB and the fixing stud 1 is Z'. The measure Z' is 1–20 mm and preferably 2–15 mm. In the case of FIGS. 3 and 4, an adapter ring 5 has only been employed to enable mounting of the clamp 4 and the PCB at a certain specific point in the bottom of the housing.

Figure 5:
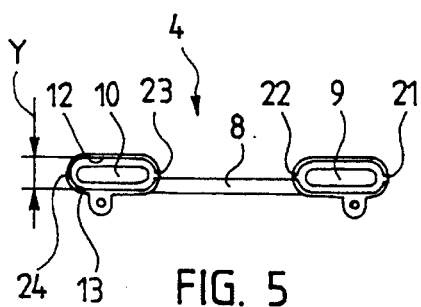
FIG. 5 shows the PCB clamp of the invention from below.
Figure 6:
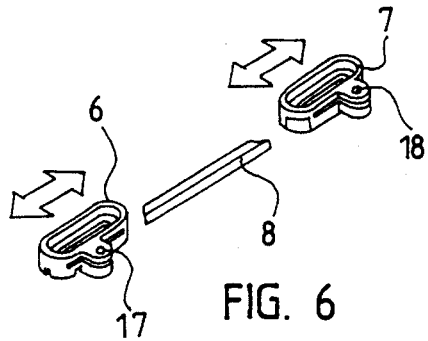
FIG. 6 illustrates the use and feature of the PCB clamp of the invention in securing non-standardized PCBs within housings.

FIG. 5 shows the clamp 4 from below. It will be seen that the edges 12, 13 surrounding the apertures 9, 10 of the clamp incorporate grooves 21, 22, 23, 24 extending in the longitudinal direction of the clamp for receiving bridges (not shown in the drawing) possibly provided between the fixing studs.

If the PCB clamp according to the figures is used in connection with other boards than Europe-boards and it is wished to secure by means of screws that the PCB remains stationary in the grooves 14, 15, the ends 6, 7 of the PCB clamp can be manually broken off the neck portion 8. Thus the ends 6, 7 become separated and the bores 17, 18 can be fitted at a distance corresponding to the distance between the holes in the PCB. For the break-off, weakening points 25, 26 are provided in the crossing between the neck portion 8 and ends 6, 7. It can naturally be contemplated that instead of two weakening points, the neck portion 8 incorporates only one weakening point, which may be positioned at any point along the length of the neck portion. The clamp is preferably made of plastic, on account of which break-off easy without tools is easy.

The invention has been described above with reference to one preferred embodiment only, and it is therefore to be noted that in its details the invention can be implemented in many ways within the scope of the inventive idea and the appended claims. Thus it is possible, for example, that the grooves 14 and 15 are not provided at the ends of the clamp but in the neck portion 8. A groove provided in the neck portion will not work, however, if mounting the PCB requires that the ends 6, 7 must be broken off from the neck portion. It is even possible that no longitudinal groove for receiving the PCB is provided. A groove is highly preferable, however, for the above reasons. Both of the apertures at the ends of the clamp need not necessarily be elongated. Yet two elongated apertures afford considerably more possibilities for mounting the clamp in various housings. It can be contemplated that apertures 9 and 10 are utilized to secure both the clamp and the PCB, in which event the PCB is screwed to the edges of the openings 9 and 10 with a self-working screw.

We claim:

1. A printed circuit board clamp for clamping a printed circuit board to a housing of electronic, electric and apparatus installations, which clamp is to be secured to at least one fixing stud disposed at a bottom of the housing and is provided with a bore, and the clamp comprising:

an elongated body having two ends and an interconnecting neck portion between the two ends;

fixing means for securing the printed circuit board to the clamp, each of the two ends of the clamp having a throughgoing aperture to receive a fastener and at least one of said apertures being elongatedly shaped, and for securing the clamp to said fixing stud;

wherein the neck portion comprises a weakening point for manually separating at least one of the two ends of the clamp from the neck portion.

2. A printed circuit board clamp as claimed in claim 1, wherein the fixing means comprises a groove having a direction of the clamp for receiving the printed circuit board, said groove is provided at both ends of the clamp and is at such a distance from a surface of the clamp bearing against the fixing stud of the housing that the clamp lifts a lower surface of the printed circuit board to be spaced from an upper surface of the fixing stud.

3. A printed circuit board clamp as claimed in claim 2, wherein the fixing means comprises a bore made in each of the two ends for fixing the printed circuit board with a second fastener.

4. A printed circuit board clamp as claimed in claim 2, wherein the grooves provided in the two ends are adapted to lift the lower surface of the printed circuit board at a distance of 1–20 mm from the upper surface of the fixing studs.

5. A printed circuit board clamp as claimed in claim 1, wherein the apertures at the two ends are shaped as elongated apertures having a longitudinal direction of the clamp.

6. A printed circuit board clamp as claimed in claim 1, wherein the apertures are surrounded by edges for surrounding an outer periphery of an adapter ring which is mounted between the clamp and fixing studs, and for securing the clamp without spacing relative to the adapter ring and fixing studs.

7. A printed circuit board clamp as claimed in claim 1, wherein the clamp is made of plastic.

\* \* \* \* \*